(12) United States Patent
Taguchi et al.

(10) Patent No.: US 8,173,053 B2
(45) Date of Patent: May 8, 2012

(54) WHITE HEAT-CURABLE SILICONE RESIN COMPOSITION AND OPTOELECTRONIC PART CASE

(75) Inventors: Yusuke Taguchi, Annaka (JP); Junichi Sawada, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 76 days.

(21) Appl. No.: 12/480,129

(22) Filed: Jun. 8, 2009

(65) Prior Publication Data

US 2009/0306263 A1 Dec. 10, 2009

(30) Foreign Application Priority Data

Jun. 9, 2008 (JP) ................................. 2008-150328
Jun. 9, 2008 (JP) ................................. 2008-150356

(51) Int. Cl.
*B29D 11/00* (2006.01)
*C08L 83/04* (2006.01)
*C08L 83/06* (2006.01)

(52) U.S. Cl. ................ 264/1.1; 428/35.7; 524/588
(58) Field of Classification Search ............. 524/588; 264/1.1
See application file for complete search history.

(56) References Cited

U.S. PATENT DOCUMENTS

| | | | |
|---|---|---|---|
| 3,792,012 A * | 2/1974 | Zdaniewski | 523/213 |
| 3,843,601 A | 10/1974 | Bruner | |
| 4,000,108 A * | 12/1976 | Yokokawa et al. | 523/219 |
| 4,102,970 A * | 7/1978 | Deubzer et al. | 264/176.1 |
| 4,292,225 A * | 9/1981 | Theodore et al. | 524/268 |
| 4,670,530 A | 6/1987 | Beck | |
| 4,743,670 A | 5/1988 | Yoshida et al. | |
| 5,538,793 A | 7/1996 | Inokuchi et al. | |
| 6,069,201 A * | 5/2000 | Okinoshima et al. | 524/783 |
| 6,114,429 A * | 9/2000 | Yamada et al. | 524/432 |
| 6,180,704 B1 * | 1/2001 | Takuman et al. | 524/267 |
| 6,274,890 B1 * | 8/2001 | Oshio et al. | 257/98 |
| 6,387,537 B1 * | 5/2002 | Umika | 428/620 |
| 6,806,509 B2 * | 10/2004 | Yoshino et al. | 257/103 |
| 7,329,706 B2 * | 2/2008 | Fukui et al. | 524/588 |
| 7,527,991 B2 | 5/2009 | Sato et al. | |
| 7,601,773 B2 * | 10/2009 | Horikoshi et al. | 524/439 |
| 2002/0155259 A1 * | 10/2002 | Kume et al. | 428/195 |
| 2005/0227393 A1 | 10/2005 | Sato et al. | |
| 2005/0244649 A1 * | 11/2005 | Kashiwagi et al. | 428/413 |
| 2006/0035092 A1 | 2/2006 | Shimizu et al. | |

(Continued)

FOREIGN PATENT DOCUMENTS

DE 2262752 A1 7/1973

(Continued)

OTHER PUBLICATIONS

Machine translation of JP-2006-140207, 11 pages, translation generated Oct. 2010.*

(Continued)

*Primary Examiner* — Robert Loewe
(74) *Attorney, Agent, or Firm* — Birch, Stewart, Kolasch & Birch LLP

(57) ABSTRACT

A white heat-curable silicone resin composition comprising (A) a heat-curable organopolysiloxane, (B) a white pigment, (C) an inorganic filler, and (D) a condensation catalyst cures into a white uniform product having heat resistance, light resistance and minimal yellowing. The cured composition has a thermal conductivity of 1-10 W/mK. The composition is useful for forming cases on optoelectronic parts, typically LED.

16 Claims, 1 Drawing Sheet

U.S. PATENT DOCUMENTS

| | | | |
|---|---|---|---|
| 2006/0180925 A1* | 8/2006 | Lee et al. .................. 257/717 |
| 2006/0226774 A1 | 10/2006 | Sofue et al. |
| 2006/0261366 A1* | 11/2006 | Yang ........................ 257/100 |
| 2007/0007558 A1* | 1/2007 | Mazzochette ............. 257/239 |
| 2007/0099008 A1* | 5/2007 | Shimizu et al. ........... 428/447 |
| 2007/0099009 A1* | 5/2007 | Shimizu et al. ........... 428/447 |
| 2007/0284589 A1* | 12/2007 | Ng et al. .................... 257/79 |
| 2008/0039555 A1* | 2/2008 | Ruyters et al. ............ 523/429 |
| 2008/0117619 A1* | 5/2008 | Pang et al. .................. 362/84 |
| 2010/0230693 A1* | 9/2010 | Tran ............................ 257/98 |

FOREIGN PATENT DOCUMENTS

| | | |
|---|---|---|
| EP | 1889877 A1 | 2/2008 |
| JP | 59-96122 A | 6/1984 |
| JP | 59-232146 A | 12/1984 |
| JP | 62-270660 A | 11/1987 |
| JP | 63-77942 A | 4/1988 |
| JP | 3-93834 A | 4/1991 |
| JP | 4-198324 A | 7/1992 |
| JP | 7-196815 A | 8/1995 |
| JP | 2656336 B2 | 9/1997 |
| JP | 9-310007 A | 12/1997 |
| JP | 2000-196151 A | 7/2000 |
| JP | 2001-234032 A | 8/2001 |
| JP | 2001-316591 A | 11/2001 |
| JP | 2002-302533 A | 10/2002 |
| JP | 2003-224305 A | 8/2003 |
| JP | 3512732 B2 | 3/2004 |
| JP | 2005-306952 A | 11/2005 |
| JP | 2006-77234 A | 3/2006 |
| JP | 2006-140207 A | 6/2006 |
| JP | 2007-235085 A | 9/2007 |
| JP | 2007-270054 A | 10/2007 |
| JP | 2007-297601 A | 11/2007 |
| WO | WO 2007/099863 A1 | 9/2007 |

OTHER PUBLICATIONS http://www.chemicalland21.com/industrialchem/inorganic/CALCIUM%20STEARATE.htm, no date given.*

European Search Report issued Feb. 12, 2010, in European Application No. 09007553.2.

Bahadur et al., "Silicone Materials for LED Packaging," Proc. of SPIE, vol. 6337, 2006, pp. 63370F-1-63370F-7, XP-002522684.

Electronics Packaging Technology, vol. 20, No. 4, Apr. 2004, pp. 23-31.

Extended European Search Report, dated May 18, 2009, for European Application No. 08254157.4.

Extended European Search Report, dated Nov. 24, 2009, for European Application No. 09007554.0.

U.S. Office Action, dated Nov. 3, 2010, for U.S. Appl. No. 12/480,118.

U.S. Office Action, dated Nov. 4, 2010, for U.S. Appl. No. 12/344,048.

Wong, "Thermal-Mechanical Enhanced High-Performance Silicone Gels and Elastomeric Encapsulants in Microelectronic Packaging," IEEE Transactions on Components, Packaging, and Manufacturing Technology—Part A, No. 2, Jun. 18, 1995, pp. 270-273.

* cited by examiner

WHITE HEAT-CURABLE SILICONE RESIN COMPOSITION AND OPTOELECTRONIC PART CASE

CROSS-REFERENCE TO RELATED APPLICATION

This non-provisional application claims priority under 35 U.S.C. §119(a) on Patent Application Nos. 2008-150328 and 2008-150356 filed in Japan on Jun. 9, 2008 and Jun. 9, 2008, respectively, the entire contents of which are hereby incorporated by reference.

TECHNICAL FIELD

This invention relates to white heat-curable silicone resin compositions for forming optoelectronic part cases, featuring whiteness, heat resistance, light resistance, uniformity and minimal yellowing, and imparting a cured product having a high thermal conductivity. It also relates to cases for receiving optoelectronic parts, typically LED, the cases being formed of the compositions in the cured state.

BACKGROUND ART

Optical semiconductor parts such as light-emitting diodes (LED) have many advantages including small size, efficiency, vivid color emission, elimination of bulb failure, excellent drive characteristics, resistance to vibration, and resistance to repeated turn-on and off. These parts are thus often utilized as various indicators and light sources. Optoelectronic devices using optical semiconductor parts are enclosed in cases or packages, which are now typically made of polyphthalamide (PPA) resins.

The current rapid advance of the photo-semiconductor technology has brought about photo-semiconductor devices of increased output and shorter wavelength. Photo-semiconductor devices are often encapsulated or encased using prior art PPA resins as colorless or white material. However, these encapsulants and cases are substantially degraded during long-term service and susceptible to visible color shading, separation and a lowering of mechanical strength. It is desired to overcome these problems effectively.

More particularly, JP 2,656,336 discloses that an optoelectronic device is encapsulated with a B-staged epoxy resin composition, in the cured state, comprising an epoxy resin, a curing agent, and a cure promoter, the components being uniformly mixed on a molecular level. As to the epoxy resin, it is described that bisphenol A epoxy resins or bisphenol F epoxy resins are mainly used although triglycidyl isocyanate and the like may also be used. In examples, a minor amount of triglycidyl isocyanate is added to the bisphenol A or F epoxy resin. The present inventors have empirically found that this B-staged epoxy resin composition for semiconductor encapsulation tends to yellow when held at high temperatures for a long period of time.

Triazine derivative epoxy resins are used in LED-encapsulating epoxy resin compositions as disclosed in JP-A 2000-196151, JP-A 2003-224305, and JP-A 2005-306952. None of these patents succeed in solving the problem of yellowing during long-term service at high temperature.

JP-A 2006-140207 discloses a light reflective resin composition having a high thermal conductivity and a light reflectance of at least 80% in the wavelength region of 800 to 350 nm. Since this composition is based on an epoxy resin, it suffers from the problem that yellowing can occur during long-term service at high temperature, particularly when the LED to be encapsulated in the composition is a UV, white, blue or similar LED of the high intensity type.

JP-A 2006-077234 describes a LED-encapsulating resin composition comprising an organopolysiloxane having a weight average molecular weight of at least $5 \times 10^3$ and a condensation catalyst. Since this organopolysiloxane must be transparent and liquid at room temperature, the composition does not lend itself to transfer molding and compression molding.

The heat released from LED is one factor that can degrade transparent encapsulants and reflectors used in LED packages and thus causes a loss of intensity or luminance. There is a need for a material having a high reflectance and a high thermal conductivity or heat resistance.

At the present, cases for optoelectronic parts such as LED are generally manufactured by mounting a LED chip on a lead frame, wire bonding, molding an epoxy or silicone resin thereon for encapsulation, and further molding a reflector material thereon to form an enclosure or reflector for preventing any escape of light from LED. The resin composition for enclosure must be adherent to the lead frame. Conventional enclosing resins, however, are less adherent to lead frames. Specifically, in the mounting process including a solder reflow step, the assembly is exposed to such high temperatures (215 to 260° C.) that separation may occur at the interface between the lead frame and the resin. Lack of reliability is a serious problem.

CITATION LIST

Patent Document 1: JP 2,656,336
Patent Document 2: JP-A 2000-196151
Patent Document 3: JP-A 2003-224305
Patent Document 4: JP-A 2005-306952
Patent Document 5: JP-A 2006-140207
Patent Document 6: JP-A 2006-077234
Patent Document 7: JP-A 2007-235085
Patent Document 8: JP-A 2007-297601

SUMMARY OF INVENTION

An object of the invention is to provide a white heat-curable silicone resin composition for forming optoelectronic part cases, which cures into a white uniform product having heat resistance, light resistance, minimal yellowing and high thermal conductivity; and a case for optoelectronic parts, typically LED, made of the cured composition.

The inventors have found that a white heat-curable silicone resin composition comprising (A) a heat-curable organopolysiloxane, (B) a white pigment, (C) an inorganic filler excluding the white pigment, and (D) a condensation catalyst as essential components cures into a white uniform product having heat resistance, light resistance and minimal yellowing as well as a high thermal conductivity, and is thus useful for forming cases on optoelectronic parts, typically LED. This is true particularly when the cured composition has a thermal conductivity of 1 to 10 W/mK.

The inventors have also found that a white heat-curable silicone resin composition further comprising (F) a silane coupling agent, and/or (G) an adhesive aid which is an epoxy resin having the compositional formula (2), defined below, cures into a product which is fully adherent to a substrate as demonstrated by a bond strength of at least 4 MPa and is thus useful for forming cases on optoelectronic parts.

The present invention is a white heat-curable silicone resin composition for forming optoelectronic part cases, comprising as essential components, (A) a heat-curable organopolysiloxane,
(B) a white pigment,
(C) an inorganic filler excluding the white pigment, and
(D) a condensation catalyst,
the composition having a thermal conductivity of 1 to 10 W/mK.

In a preferred embodiment, the white pigment (B) is one or more members selected from the group consisting of titanium dioxide having an average particle size of 0.05 to 5.0 μm, and potassium titanate, zirconium oxide, zinc sulfide, zinc oxide, alumina, and magnesium oxide, each having an average particle size of 0.1 to 3.0 μm, and the inorganic filler (C) is one or more members selected from the group consisting of alumina, zinc oxide, silicon nitride, aluminum nitride and boron nitride, each having an average particle size of 4 to 40 μm.

In a preferred embodiment, a powder mixture of the white pigment (B) and the inorganic filler (C) has a particle size distribution having maximum peaks in the three ranges of 0.4 to 1.0 μm, 8 to 18 μm, and 30 to 50 μm.

In another preferred embodiment, the white pigment (B) and the inorganic filler (C) are present in a total amount of 50 to 95% by weight based on the total weight of the composition.

In a preferred embodiment, the heat-curable organopolysiloxane (A) has the average compositional formula (1):

$$R^1_x Si(OR^2)_y (OH)_z O_{(4-x-y-z)/2} \tag{1}$$

wherein $R^1$ is each independently an organic group of 1 to 20 carbon atoms, $R^2$ is each independently an organic group of 1 to 4 carbon atoms, x, y and z are numbers satisfying $0.8 \leq x \leq 1.5$, $0 \leq y \leq 0.3$, $0.001 \leq z \leq 0.5$, and $0.801 \leq x+y+z < 2$.

Typically, the white pigment (B) is titanium dioxide.

The composition may further comprise (E) a parting agent comprising calcium stearate having a melting point of 120 to 140° C. and is present in an amount of 0.2 to 5.0% by weight based on the total weight of the composition.

The composition may further comprises (F) a silane coupling agent and/or (G) an adhesive aid which is a 1,3,5-triazine nucleus derivative epoxy resin having the compositional formula (2):

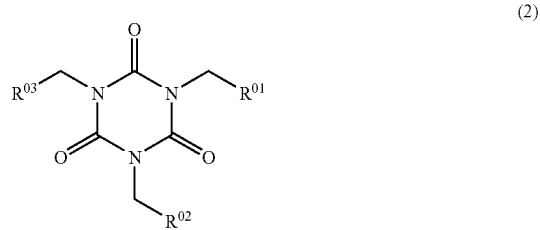

wherein $R^{01}$, $R^{02}$ and $R^{03}$ each are an organic group of 1 to 10 carbon atoms, at least one of $R^{01}$, $R^{02}$ and $R^{03}$ containing an epoxy group.

In this case, the condensation catalyst (D) is preferably an organometallic condensation catalyst. The organometallic condensation catalyst is preferably zinc benzoate.

Also provided is an optoelectronic part case comprising the white heat-curable silicone resin composition of the third embodiment in the cured state, in which a transparent resin-encapsulated optoelectronic part is enclosed.

ADVANTAGEOUS EFFECTS OF INVENTION

Since the white heat-curable silicone resin compositions according to the invention cure into white uniform products having heat resistance, resistance to light (including emission from optoelectronic parts) and minimal yellowing and exhibiting a high thermal conductivity, they are useful in forming cases for enclosing optoelectronic parts such as LED.

DESCRIPTION OF EMBODIMENTS

Figure 1:
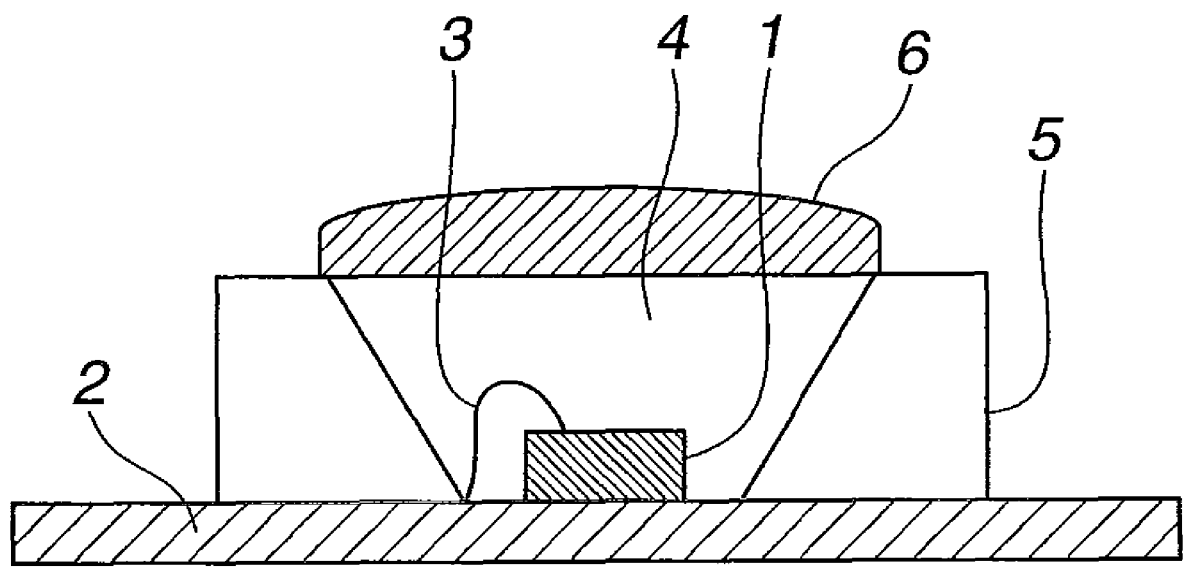
FIG. 1 schematically illustrates an optoelectronic device in a case (in the form of LED reflector) made of the heat-curable silicone resin composition of the invention.

The singular forms "a," "an" and "the" include plural references unless the context clearly dictates otherwise.

As used herein, the term "average particle size" is determined as weight average value $D_{50}$ or median diameter upon particle size distribution measurement by the laser light diffraction method.

The term "phr" refers to parts by weight per 100 parts by weight of component (A) unless otherwise stated.

The invention provides a white heat-curable silicone resin composition for forming optoelectronic part cases, comprising as essential components, (A) a heat-curable organopolysiloxane, (B) a white pigment, (C) an inorganic filler excluding the white pigment, and (D) a condensation catalyst, the composition having a thermal conductivity of 1 to 10 W/mK.

Now the components used are described in detail.

A. Organopolysiloxane

Component (A) is a heat-curable organopolysiloxane, specifically a silanol-containing organopolysiloxane, and more specifically a silicone polymer having the average compositional formula (1):

$$R^1_x Si(OR^2)_y (OH)_z O_{(4-x-y-z)/2} \tag{1}$$

wherein $R^1$ is each independently an organic group of 1 to 20 carbon atoms, $R^2$ is each independently an organic group of 1 to 4 carbon atoms, x, y and z are numbers satisfying the range: $0.8 \leq x \leq 1.5$, $0 \leq y \leq 0.3$, $0.001 \leq z \leq 0.5$, and $0.801 \leq x+y+z < 2$.

The organic groups represented by $R^1$ include substituted or unsubstituted monovalent hydrocarbon groups of 1 to 20 carbon atoms, for example, $C_1$-$C_{20}$ alkyl, $C_2$-$C_{20}$ alkenyl, $C_6$-$C_{20}$ aryl, and $C_7$-$C_{20}$ aralkyl groups. Of the alkyl groups, $C_1$-$C_{10}$ alkyl groups are preferred and may be straight, branched or cyclic. Examples include methyl, ethyl, n-propyl, isopropyl, n-butyl, isobutyl, sec-butyl, tert-butyl, pentyl, hexyl, octyl, cyclopentyl, and cyclohexyl. Of the alkenyl groups, $C_2$-$C_{10}$ alkenyl groups are preferred, examples of which include vinyl, allyl and propenyl. Of the aryl groups, $C_6$-$C_{10}$ aryl groups are preferred, examples of which include phenyl, tolyl, xylyl and naphthyl. Of the aralkyl groups, $C_7$-$C_{10}$ aralkyl groups are preferred, examples of which include benzyl, phenethyl, phenylpropyl and naphthylmethyl. Also included are substituted forms of the foregoing monovalent hydrocarbon groups in which one or more hydrogen atoms are replaced by halogen atoms, cyano groups or the like. In average compositional formula (1), $R^1$ is most preferably methyl or phenyl.

The $C_1$-$C_4$ organic groups represented by $R^2$ include alkyl and alkenyl groups. $OR^2$ stands for a terminal group on a siloxane resin other than silanol (Si—OH) groups, for example, methoxy, ethoxy, propoxy, isopropoxy and butoxy groups. Of these, methoxy and isopropoxy are preferred because the starting reactants are readily available.

In average compositional formula (1), x, y and z are numbers satisfying the range: $0.8 \leq x \leq 1.5$, $0 \leq y \leq 0.3$, $0.001 \leq z \leq 0.5$, and $0.801 \leq x+y+z < 2$, and preferably $0.9 \leq x \leq 1.3$, $0.001 \leq y \leq 0.2$, $0.01 \leq z \leq 0.3$, and $0.911 \leq x+y+z \leq 1.8$. If "x" indicative of the content of $R^1$ is less than 0.8, the polysiloxane becomes harder and less crack resistant. If "x" is more than 1.5, a higher content of organic groups enhances hydrophobicity and flexibility, losing the anti-cracking effect and leading to defective appearance due to cissing. If "y" indicative of the content of $OR^2$ is more than 0.3, the polysiloxane tends to have a more content of terminal groups and a lower molecular weight, failing to exert the anti-cracking effect. If "z" indicative of the content of OH is more than 0.5, a more proportion of groups participate in condensation reaction upon heat curing, leading to a higher hardness and less crack resistance. If "z" is less than 0.001, the polysiloxane tends to have a higher melting point and becomes awkward to work. The value of "z" is preferably controlled by tailoring the percent complete condensation of alkoxy groups to the range of 86 to 96%. There is a tendency that the melting point becomes lower at a condensation of less than 86% and excessively high at a condensation of more than 96%.

The organopolysiloxane having average compositional formula (1) as component (A) may also be represented by a combination of Q units ($SiO_{4/2}$) derived from tetrafunctional silane, T units ($R^1SiO_{3/2}$) derived from trifunctional silane, D units ($R^1SiO_{2/2}$) derived from difunctional silane, and M units ($R^1SiO_{1/2}$) derived from monofunctional silane. When the organopolysiloxane is expressed by this notation, desirably a molar proportion of T units ($R^1SiO_{3/2}$) is at least 70 mol %, more desirably at least 75 mol %, and even more desirably at least 80 mol %, based on the total moles of entire siloxane units. If the proportion of T units is less than 70 mol %, an overall profile of hardness, adhesion and appearance may be compromised. It is noted that the balance may consist of M, D and Q units, the sum of these units being desirably equal to or less than 30 mol %. With respect to the melting point, there is a tendency that the melting point rises with an increasing proportion of Q and T units, and the melting point lowers with an increasing proportion of D and M units. It is preferred that the molar proportion of T units ($R^1SiO_{3/2}$) be at least 70 mol % and D units account for the remaining proportion of up to 30 mol %.

The organopolysiloxane as component (A) has a melting point of 40 to 130° C., and preferably 70 to 80° C. If the melting point is below 40° C., the organopolysiloxane is not solid or remains still solid with a sticky surface and is difficult to transfer mold. If the melting point is above 130° C., the organopolysiloxane loses flow and is difficult to transfer mold.

The organopolysiloxane as component (A) may be prepared through hydrolytic condensation of an organosilane having the general formula (3):

$$R^1_n SiX_{4-n} \quad (3)$$

wherein $R^1$ is each independently an organic group of 1 to 20 carbon atoms, preferably $C_1$-$C_{20}$ alkyl, $C_2$-$C_{20}$ alkenyl, $C_6$-$C_{20}$ aryl or $C_7$-$C_{20}$ aralkyl group; X is a halogen atom such as chlorine or an alkoxy group, typically $C_1$-$C_4$ alkoxy group; and n is 1, 2 or 3.

In average compositional formula (3), X is preferably a halogen atom, especially chlorine because organopolysiloxanes in solid form can be prepared.

In formula (3), n is an integer of 1 to 3. Where n is 2 or 3, i.e., a plurality of $R^1$ are included, each $R^1$ may be the same or different. Herein, n=1 is preferred because organopolysiloxanes in solid form can be prepared.

Examples of the silane compound having formula (3) include organotrichlorosilanes and organotrialkoxysilanes such as methyltrichlorosilane, ethyltrichlorosilane, phenyltrichlorosilane, methylvinyldichlorosilane, vinyltrichlorosilane, diphenyldichlorosilane, methyltrimethoxysilane, methyltriethoxysilane, ethyltrimethoxysilane, ethyltriethoxysilane, phenyltrimethoxysilane, vinyltrimethoxysilane, and phenyltriethoxysilane; and diorganodialkoxysilanes such as dimethyldimethoxysilane, dimethyldiethoxysilane, diphenyldimethoxysilane, diphenyldiethoxysilane, methylvinyldimethoxysilane, methylphenyldimethoxysilane, and methylphenyldiethoxysilane. Of these, methyltrichlorosilane is most preferred. It is also effective to use methyltrichlorosilane in combination with phenyltrichlorosilane.

For these silane compounds, a choice of a trichlorosilane or trialkoxysilane and its amount used are preferably determined so as to produce a silanol-bearing organopolysiloxane containing at least 70 mol % of T units.

Any standard technique may be applied when the above-mentioned silane compound having a hydrolyzable group is hydrolyzed and condensed. Preferably the reaction is carried out in the presence of an acid catalyst such as acetic acid, hydrochloric acid or sulfuric acid or a basic catalyst such as sodium hydroxide, potassium hydroxide or tetramethylammonium hydroxide. In an example where a silane having chloro as the hydrolyzable group is used, hydrochloric acid forms as a result of addition of water and serves as the catalyst whereby a hydrolytic condensate having the desired molecular weight may be obtained.

Upon hydrolysis and condensation, the amount of water added is usually 0.9 to 1.6 moles and preferably 1.0 to 1.3 moles per mole of total hydrolyzable groups (e.g., chloro groups) in the silane compound(s). Insofar as the amount of water is in the range of 0.9 to 1.6 moles, the resulting composition is effective to work and cures into a tough product.

Preferably the silane compound having a hydrolyzable group is hydrolyzed in an organic solvent typically selected from alcohols, ketones, esters, cellosolves, and aromatic compounds. Suitable organic solvents include alcohols such as methanol, ethanol, isopropyl alcohol, isobutyl alcohol, n-butanol, and 2-butanol and aromatic compounds such as toluene and xylene. More preferably a mixture of isopropyl alcohol and toluene is used because the resulting composition becomes effectively curable and the cured product becomes tougher.

The reaction temperature for hydrolysis and condensation is preferably 10 to 120° C., and more preferably 20 to 100° C. This reaction temperature range ensures to produce a solid hydrolytic condensate without gelation so that it is ready for use in the subsequent step.

One exemplary synthesis process starting with methyltrichlorosilane is described. To a solution of methyltrichlorosilane in toluene, water and isopropyl alcohol are added, whereupon partial hydrolysis takes place at a temperature between −5° C. and 100° C. Then water is added in an amount sufficient to hydrolyze the entire amount of remaining chloro groups whereupon reaction takes place, yielding a solid silicone polymer having a melting point of 76° C.

The desired organopolysiloxane is obtained in this way. The organopolysiloxane typically has a melting point of 50 to 100° C., and preferably 70 to 80° C. If the melting point is below 50° C. or above 100° C., a problem of inefficient kneading arises in the subsequent mixing step.

B. White Pigment

Component (B) is a white pigment which is blended as a white colorant for enhancing whiteness. In the present invention, the preferred white pigment is titanium dioxide whose unit cell may be of the rutile, anatase or brookite type, with the rutile type being preferred. Also, the average particle size and shape of titanium dioxide are not limited although an average particle size of 0.05 to 5.0 μm is generally used. Titanium dioxide may be previously surface treated with hydrated oxides of aluminum, silicon and the like in order to enhance its compatibility with and dispersibility in resins and inorganic fillers.

Besides titanium dioxide, other white pigments or colorants such as potassium titanate, zirconium oxide, zinc sulfide, zinc oxide, alumina, and magnesium oxide having an average particle size of 0.1 to 3.0 μm may be used alone or in combination with titanium dioxide.

The amount of the white pigment blended is 3 to 200 parts, desirably 5 to 150 parts, and more desirably 10 to 120 parts by weight per 100 parts by weight of component (A). Less than 3 phr of the white pigment may fail to achieve the desired whiteness, and the resulting composition may cure into a product not having an initial reflectance value in the 400-800 nm wavelength region of at least 70%, especially at least 80% and an aged reflectance value of at least 70%, especially at least 80% after a heat age test of heating at 180° C. for 24 hours. More than 200 phr of the white pigment may give rise to a problem of reducing the proportion of other components which are added for the purpose of enhancing mechanical strength. The white pigment is desirably present in an amount of 1 to 50% by weight, more desirably 5 to 30% by weight, and even more desirably 8 to 30% by weight, based on the total weight of the silicone resin composition.

C. Inorganic Filler

Component (C) is an inorganic filler. The filler is selected from those commonly used in silicone resin compositions, for example, silicas such as fused silica, fused spherical silica, and crystalline silica, alumina, zinc oxide, silicon nitride, aluminum nitride, and boron nitride, with the proviso that the aforementioned white pigment (or white colorant) is excluded. These inorganic fillers may be used alone or in admixture of two or more. The particle size and shape of inorganic filler are not particularly limited although an average particle size of 4 to 40 μm is preferred, with a particle size of 7 to 35 μm being more preferred.

Specifically, alumina is preferably used for high thermal conductivity and high fluidity. An average particle size of 4 to 40 μm, especially 7 to 35 μm is preferred for moldability and fluidity. A higher fluidity is desirably achievable when an alumina powder of a particle size distribution having three peaks in a fine range of 0.4 to 1.0 μm, a medium range of 8 to 18 μm, and a coarse range of 30 to 50 μm is used. In this powder, an alumina faction falling in the fine or submicron range of 0.4 to 1.0 μm serves as the white pigment.

As discussed above, alumina serves as the inorganic filler when it has an average particle size of 4 to 40 μm and as the white pigment when it has an average particle size of 0.1 to 3.0 μm. Alumina serving as the white pigment is effective in light reflection and specifically, effective to provide a reflectance of at least 80% in a wavelength region equal to or less than 400 nm. However, since compounding alumina of the submicron range provides the composition with a noticeable viscosity buildup, it is precluded to incorporate a large amount of such alumina.

The inorganic filler which has been surface treated with coupling agents such as silane and titanate coupling agents for enhancing the bond strength between the resin and the filler may also be blended. Suitable coupling agents include epoxy-functional alkoxysilanes such as γ-glycidoxypropyltrimethoxysilane, γ-glycidoxypropylmethyldiethoxysilane, and β-(3,4-epoxycyclohexyl)ethyltrimethoxysilane; amino-functional alkoxysilanes such as N-β-(aminoethyl)-γ-aminopropyltrimethoxysilane, γ-aminopropyltriethoxysilane and N-phenyl-γ-aminopropyltrimethoxysilane; and mercapto-functional alkoxysilanes such as γ-mercaptopropyltrimethoxysilane. The amount of the coupling agent used and the surface treatment method are not particularly limited. Preferred are those treated fillers which undergo no yellowing upon exposure to 150° C. or higher temperatures.

The amount of the inorganic filler blended is preferably at least 50 parts, more preferably at least 100 parts, even more preferably at least 150 parts by weight and up to 1,000 parts, more preferably up to 950 parts, even more preferably up to 900 parts, most preferably up to 800 parts by weight per 100 parts by weight of component (A). The inorganic filler is desirably present in an amount of 40 to 92% by weight, and more desirably 60 to 90% by weight, based on the total weight of the silicone resin composition.

The amount of white pigment and inorganic filler combined is desirably 50 to 95% by weight, and more desirably 75 to 91% by weight, based on the total weight of the silicone resin composition. If the combined amount is less than 50 wt %, the composition may have a higher coefficient of expansion and lower mechanical strength. More than 95 wt % may bring about a viscosity buildup and a loss of flexibility, leading to short-shots and defectives in packages such as delamination.

D. Condensation Catalyst

Component (D) is a condensation or curing catalyst. It is a condensation catalyst for promoting the curing of a heat curable silicone resin as component (A). A particular condensation catalyst is selected while taking into account the stability of component (A), the hardness of a coating, non-yellowing, and curing ability. Suitable catalysts include organometallic catalysts such as zinc salts of organic acids, Lewis acid catalysts, organoaluminum compounds, and organotitanium compounds. Also included are basic compounds such as trimethylbenzylammonium hydroxide, tetramethylammonium hydroxide, n-hexylamine, tributylamine, diazabicycloundecene (DBU), and dicyandiamide; metal-containing compounds such as tetraisopropyl titanate, tetrabutyl titanate, titanium acetylacetonate, aluminum triisobutoxide, aluminum triisopropoxide, zirconium tetra(acetylacetonate), zirconium tetrabutyrate, cobalt octylate, cobalt acetylacetonate, iron acetylacetonate, tin acetylacetonate, dibutyltin octylate, dibutyltin laurate, zinc octylate, zinc benzoate, zinc p-tert-butylbenzoate, zinc laurate, zinc stearate, aluminum phosphate, and aluminum triisopropoxide; and aluminum trisacetylacetonate, aluminum bisethylacetoacetate monoacetylacetonate, and organotitanium chelates such as diisopropoxybis(ethylacetoacetato)titanium and diisopropoxybis(ethylacetoacetato)titanium. Of these, preference is given to zinc octylate, zinc benzoate, zinc p-tert-butylbenzoate, zinc laurate, zinc stearate, aluminum phosphate, aluminum triisopropoxide, and organotitanium chelates. Inter alia, zinc benzoate is most preferred.

The condensation catalyst may be used in an amount of at least 0.0001 part, specifically at least 0.001 part by weight per 100 parts by weight of component (A). Preferably the curing catalyst is used in an amount of 0.01 to 10 parts, more preferably 0.1 to 6 parts by weight per 100 parts by weight of component (A). An amount of the catalyst within this range provides an effective stable cure process.

In addition to the above components, the following additional components may be incorporated.

E. Parting Agent

In the silicone resin composition, (E) an internal parting agent may be compounded. The internal parting agent is used for the purpose of facilitating removal of a molded part from the mold. The parting agent is added in an amount of 0.2 to 5.0% by weight of the overall composition. Examples of the internal parting agent include natural waxes such as carnauba wax, and synthetic waxes such as acid wax, polyethylene wax, and fatty acid esters. Inter alia, calcium stearate having a melting point of 120 to 140° C. is desired. The parting agent is effective in restraining yellowing upon exposure to high temperatures or light and maintains good parting properties over a long period.

F. Silane Coupling Agent

In the silicone resin composition, (F) a silane coupling agent may be compounded for enhancing the bond strength between the resin and the inorganic filler. Suitable coupling agents include epoxy-functional alkoxysilanes such as γ-glycidoxypropyltrimethoxysilane, γ-glycidoxypropylmethyldiethoxysilane, and β-(3,4-epoxycyclohexyl)ethyltrimethoxysilane; amino-functional alkoxysilanes such as N-β-(aminoethyl)-γ-aminopropyltrimethoxysilane, γ-aminopropyltriethoxysilane and N-phenyl-γ-aminopropyltrimethoxysilane; and mercapto-functional alkoxysilanes such as γ-mercaptopropyltrimethoxysilane. The amount of the coupling agent used and the surface treatment method are not particularly limited.

The silane coupling agent may be used in an amount of 0.1 to 8.0 parts, preferably 0.5 to 6.0 parts by weight per 100 parts by weight of component (A). Less than 0.1 phr of the coupling agent may achieve insufficient adhesion to substrates. More than 8.0 phr of the coupling agent may invite an extreme drop of viscosity, causing voids and flashes.

G. Adhesive Aid

In the silicone resin composition, (G) an adhesive aid may be compounded. The adhesive aid is used for enhancing adhesion and may be added in an amount of 0.2 to 5.0% by weight based on the overall composition. It is a 1,3,5-triazine nucleus derivative epoxy resin having the compositional formula (2).

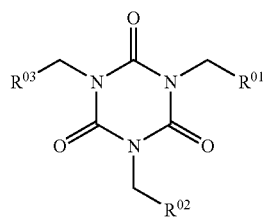

(2)

Herein, each of $R^{01}$, $R^{02}$ and $R^{03}$ is an organic group of 1 to 10 carbon atoms, typically alkyl group, and at least one of $R^{01}$, $R^{02}$ and $R^{03}$ contains an epoxy group. Suitable epoxy-containing groups include glycidyl and glycidoxy. Useful examples include tris(2,3-epoxypropyl)isocyanate wherein $R^{01}$, $R^{02}$ and $R^{03}$ are all glycidyl, monoallyldiglycidylisocyanurate, 1-allyl-3,5-(2-methylepoxypropyl)isocuanurate, 1-(2-methylpropenyl)-3,5-diglycidylisocyanurate, 1-(2-methylpropenyl)-3,5-(2-methylepoxypropyl)isocyanurate.

Those adhesive aids which do not yellow upon exposure to high temperatures or light are desired.

Other Additives

If necessary, the silicone resin composition may further include various other additives. For example, various whiskers, silicone powder, thermoplastic resins, thermoplastic elastomers, organic synthetic rubbers, and other additives may be used for the purposes of improving certain properties of the resin insofar as they do not compromise the objects of the invention.

In the silicone resin composition, phenol, phosphorus or sulfur-based antioxidants may be blended if desired. Even absent such antioxidants, the composition of the invention experiences less discoloration than conventional heat-curable silicone resin compositions.

The silicone resin composition of the invention is heat curable. For example, it cures by heating at a temperature of 150 to 185° C. for 30 to 180 seconds. This may be followed by post-curing at 150 to 180° C. for 2 to 20 hours.

The cured product obtained by curing the white heat-curable silicone resin composition comprising essential components (A) to (D) according to the invention has a thermal conductivity of 1 to 10 W/mK, preferably 1.5 to 7 W/mK, and more preferably 2 to 5 W/mK. A cured product with too low a thermal conductivity fails to carry away the heat release from the optoelectronic part, resulting in a premature degradation thereof. An appropriate thermal conductivity is achievable by addition of the heat conductive filler described above. It is noted that a thermal conductivity is measured by the method to be described later.

Specifically, an appropriate thermal conductivity is achieved by selecting a highly heat conductive one(s) as white pigment (B) and/or inorganic filler (C), especially as inorganic filler (C) and incorporating a relatively large amount thereof. Preferred highly heat conductive fillers include alumina, zinc oxide, silicon nitride, aluminum nitride, and boron nitride, with alumina being most preferred.

The amount of white pigment and inorganic filler combined is desirably 50 to 95% by weight, and more desirably 75 to 91% by weight, based on the total weight of the silicone resin composition. If the combined amount of white pigment and inorganic filler is less than 50 wt %, the composition may not be fully heat conductive. Increasing the filler loading beyond 95 wt % may render the composition less flowable and difficult to mold.

In the preferred embodiment, white pigment (B) and inorganic filler (C) are combined to form a powder having a particle size distribution having maximum peaks in the three ranges of 0.4 to 1.0 μm, specifically 0.4 to 0.7 μm, 8 to 18 μm, specifically 12 to 18 μm, and 30 to 50 μm, specifically 30 to 38 μm.

Alumina is advantageously used, in particular, from the standpoint of effective heat transfer. When alumina is used as white pigment (B) and/or inorganic filler (C), an alumina powder is preferred which contains 3 to 20 wt %, specifically 7 to 18 wt % of a fine alumina fraction in the fine range of average particle size 0.4 to 1.0 μm, 30 to 70 wt %, specifically 40 to 65 wt % of a medium alumina fraction in the medium range of average particle size 8 to 18 μm, and 10 to 40 wt %, specifically 20 to 30 wt % of a coarse alumina fraction in the coarse range of average particle size 30 to 50 μm. Outside the range, sufficient flow may not be obtained.

In a preferred embodiment, the cured product obtained by curing the white heat-curable silicone resin composition has a light reflectance at wavelength 450 nm, wherein an initial (just as molded) value of light reflectance is at least 70%, preferably at least 80%, and more preferably at least 85%, and an aged value of light reflectance after a heat age test of heating at 180° C. for 24 hours is at least 70%, preferably at least 80%, and more preferably at least 85%. The cured product with a reflectance value of less than 70%, when used as an optoelectronic part case, suffers from a shortened service lifetime. Also preferably, after exposure to a high-pressure mercury lamp of 365 nm peak wavelength (60 mW/cm) for 24 hours, the cured product has a reflectance value of at least 70%, preferably at least 80%, and more preferably at least 85% at wavelength 450 nm.

It is understood that a reflectance value in the range may be achieved by using a silanol-bearing organopolysiloxane of formula (1) as component (A) and incorporating a specific amount of the white pigment, typically titanium oxide.

An optoelectronic part case may be formed by molding the silicone resin composition of the invention. The case encloses and holds in its interior an optoelectronic part, such as LED encapsulated with a transparent resin such as a silicone resin or epoxy resin. The interface between the case and the transparent resin with which LED is encapsulated becomes a reflecting surface (reflector).

Accordingly, the silicone resin composition of the invention can be effectively utilized as a case for optoelectronic devices, typically LEDs, and an encapsulant or sealant for photocouplers.

FIG. 1 illustrates in cross section an LED reflector as one exemplary optoelectronic device using a case of the silicone resin composition of the invention. In the LED package shown in FIG. 1, a semiconductor part 1 composed of compound semiconductor is die-bonded to a lead frame 2 and wire-bonded to another lead frame (not shown) via a bonding wire 3. A light receiving semiconductor part (not shown) which is die-bonded to a lead frame (not shown) and wire-bonded to another lead frame (not shown) via a bonding wire (not shown) is opposed to the semiconductor part 1. A transparent encapsulant resin 4 fills in between the semiconductor parts. The semiconductor part encapsulated with the encapsulant resin 4 is further encapsulated or enclosed in a case 5 made of the silicone resin composition of the invention in the cured state. The case serves as a white reflector. A lens 6 is disposed on top of the encapsulant resin 4.

The method of molding or encapsulating the silicone resin composition around the semiconductor part is most often transfer molding or compression molding. Specifically, transfer molding is carried out by feeding the silicone resin composition to a transfer molding machine and molding under a pressure of 5 to 20 N/mm², preferably at a temperature of 120 to 190° C. for 30 to 500 seconds, and more preferably at 150 to 185° C. for 30 to 180 seconds. Compression molding is carried out by feeding the silicone resin composition to a compression molding machine and molding preferably at a temperature of 120 to 190° C. for 30 to 600 seconds, and more preferably at 130 to 160° C. for 120 to 300 seconds. Either of these molding methods may be followed by post-curing at 150 to 185° C. for 2 to 20 hours.

EXAMPLE

Examples of the invention are given below by way of illustration and not by way of limitation. All parts are by weight (pbw).

Examples 1 to 6 & Comparative Examples 1 to 4

The raw materials used in Examples and Comparative Examples are first described.
A. Heat-Curable Organopolysiloxane Synthesis Example A 1-L flask was charged with 100 parts of methyltrichlorosilane and 200 parts of toluene. Under ice cooling, a mixture of 8 parts of water and 60 parts of isopropyl alcohol was added dropwise over 5 to 20 hours while maintaining an internal temperature between −5° C. and 0° C. The reaction mixture was then heated and stirred at the reflux temperature for 20 minutes. The reaction mixture was cooled to room temperature, after which 12 parts of water was added dropwise below 30° C. over 30 minutes, followed by 20 minutes of stirring. Further 25 parts of water was added dropwise, after which the mixture was stirred at 40-45° C. for 60 minutes. Thereafter, 200 parts of water was added whereupon the organic layer was separated. The organic layer was washed until neutral. This was followed by azeotropic dehydration, filtration and vacuum stripping, yielding 36.0 parts of a heat-curable organopolysiloxane (A-1) having the following formula as a colorless transparent solid (m.p. 76° C.).

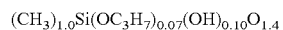

$(CH_3)_{1.0}Si(OC_3H_7)_{0.07}(OH)_{0.10}O_{1.4}$

B. White Pigment and C. Inorganic Filler
B-1: titanium dioxide, rutile type, average particle size 0.28 µm (CR-95 by Ishihara Sangyo K. K.)
C-1: alumina A, a mixture with an average particle size of 10 µm, consisting of 15 wt % of alumina with an average particle size of 0.5 µm (AO-502 by Admatechs Co., Ltd.), 60 wt % of alumina with an average particle size of 10 µm (AO-41R by Admatechs Co., Ltd.), and 25 wt % of alumina with an average particle size of 28 µm (CB-A30S by Showa Denko K.K.)
C-2: alumina B, a mixture with an average particle size of 11 µm, consisting of 10 wt % of alumina with an average particle size of 0.5 µm (AO-502 by Admatechs Co., Ltd.), 65 wt % of alumina with an average particle size of 10 µm (AO-41R by Admatechs Co., Ltd.), and 25 wt % of alumina with an average particle size of 38 µm (CB-A40 by Showa Denko K.K.)
C-3: alumina C, average particle size 50 µm (CB-A50S by Showa Denko K.K.)
C-4: spherical fused silica, average particle size 30 µm (FB-570 by Denki Kagaku Kogyo K. K.)
D. Condensation Catalyst
D-1: zinc benzoate (Wako Pure Chemical Industries, Ltd.)

White silicone resin compositions were prepared by blending (A) heat-curable organopolysiloxane, (B) white pigment, (C) inorganic filler, and (D) condensation catalyst in accordance with the formulation shown in Tables 1 and 2, milling the mixture on a roll mill, cooling and grinding.

These compositions were examined for various properties by the following tests, with the results shown in Tables 1 and 2. In all runs, the compositions were molded on a transfer molding machine.
Spiral Flow
A spiral flow was measured by molding the composition at 175° C. and 6.86 MPa for 90 seconds in a standard mold.
Hardness as Molded
The composition was molded at 175° C. and 6.86 MPa for 90 seconds into a bar of 10 mm×4 mm×100 mm. The hardness of the bar as hot molded was measured by a Shore D durometer.
Flexural Strength and Flexural Modulus
A specimen was molded in a mold in accordance with JIS K6911 at 175° C. and 6.9 N/mm² for 90 seconds before it was measured for flexural strength and flexural modulus at room temperature (25° C.).
Thermal Yellowing Resistance
A disc of 50 mm diameter and 3 mm thickness was molded at 175° C. and 6.9 N/mm² for 90 seconds. The disc was held at 180° C. for 24 hours or subjected to IR reflow. Any change of the disc surface was visually inspected as a measure of thermal yellowing resistance.
Light Reflectance
A disc of 50 mm diameter and 3 mm thickness was molded at 175° C. and 6.9 N/mm² for 90 seconds. The disc was held at 180° C. for 24 hours or irradiated with UV radiation for 24 hours under a high-pressure mercury lamp (60 mW/cm) with 365 nm peak wavelength. Immediately after molding, after 24 hours of hot holding, and after 24 hours of UV exposure, the disc (cured product) was measured for reflectance at wavelength 450 nm, using a spectrophotometer X-Rite 8200 (distributed by SDG Co., Ltd.).

Thermal Conductivity

A specimen of 50 mm diameter and 6 mm thickness was prepared by transfer molding the composition at 175° C. and 6.9 N/mm² for 90 seconds and post-curing at 180° C. for 4 hours. The specimen was sandwiched between top and bottom heaters together with a calorimeter and closely contacted therewith under pneumatic pressure. A thermal conductance was automatically computed from a temperature difference between opposite surfaces of the specimen and an output of the calorimeter at the time when the steady state at 50° C. was reached. The value of thermal conductance multiplied by the thickness of the specimen gives a thermal conductivity.

TABLE 1

| Composition (pbw) | | | | Example | | | | | |
|---|---|---|---|---|---|---|---|---|---|
| | | | | 1 | 2 | 3 | 4 | 5 | 6 |
| A. Heat-curable organopolysiloxane | | | A-1 | 100 | 100 | 100 | 100 | 100 | 100 |
| B. & C. White pigment and inorganic filler | Titanium dioxide | | B-1 | 100 | 100 | 100 | 100 | 100 | 100 |
| | Alumina A | | C-1 | 300 | 250 | 200 | 200 | | |
| | Alumina B | | C-2 | | | | | 300 | 400 |
| | Alumina C | | C-3 | | | | | | |
| | Spherical fused silica | | C-4 | | | | 100 | | |
| D. Condensation catalyst | Zinc benzoate | | D-1 | 3 | 3 | 3 | 3 | 3 | 3 |
| Test results | Spiral flow (cm) | | | 35 | 40 | 60 | 55 | 35 | 25 |
| | Flexural strength @RT (N/mm²) | | | 70 | 65 | 61 | 65 | 70 | 68 |
| | Flexural modulus @RT (N/mm²) | | | 10000 | 9100 | 8200 | 9400 | 10000 | 15000 |
| | Hardness as molded | | | 70 | 71 | 65 | 65 | 70 | 75 |
| | Thermal yellowing | Initial (Appearance) | | white | white | white | white | white | white |
| | | 180° C./24 hr holding (Appearance) | | white | white | white | white | white | white |
| | | IR reflow (Appearance) | | white | white | white | white | white | white |
| | Reflectance | Initial (%) | | 93 | 93 | 93 | 93 | 93 | 93 |
| | | 180° C./24 hr holding (%) | | 92 | 93 | 93 | 93 | 93 | 93 |
| | | 24 hr UV exposure (%) | | 93 | 93 | 93 | 93 | 93 | 93 |
| | Thermal conductivity (W/mK) | | | 4.5 | 3.1 | 2.3 | 2.6 | 4.5 | 4.9 |

TABLE 2

| Composition (pbw) | | | | Comparative Example | | | |
|---|---|---|---|---|---|---|---|
| | | | | 1 | 2 | 3 | 4 |
| A. Heat-curable organopolysiloxane | | | A-1 | 100 | 100 | 100 | 100 |
| B. & C. White pigment and inorganic filler | Titanium dioxide | | B-1 | 100 | 100 | 100 | 100 |
| | Alumina A | | C-1 | | | | |
| | Alumina B | | C-2 | | | | |
| | Alumina C | | C-3 | | | 300 | |
| | Spherical fused silica | | C-4 | 300 | 200 | | |
| D. Condensation catalyst | Zinc benzoate | | D-1 | 3 | 3 | 3 | 3 |
| Test results | Spiral flow (cm) | | | 40 | 60 | 10 | 70 |
| | Flexural strength @RT (N/mm²) | | | 64 | 60 | samples could not be prepared | 43 |
| | Flexural modulus @RT (N/mm²) | | | 9500 | 8000 | | 4000 |
| | Hardness as molded | | | 68 | 61 | | 60 |
| | Thermal yellowing | Initial (Appearance) | | white | white | | white |
| | | 180° C./24 hr holding (Appearance) | | white | white | | white |
| | | IR reflow (Appearance) | | white | white | | white |
| | Reflectance | Initial (%) | | 90 | 91 | | 93 |
| | | 180° C./24 hr holding (%) | | 90 | 90 | | 93 |
| | | 24 hr UV exposure (%) | | 90 | 90 | | 93 |
| | Thermal conductivity (W/mK) | | | 0.9 | 0.8 | | 0.4 |

The test results of Examples 1 to 6 in Table 1 demonstrate that the white heat-curable silicone resin compositions in the first embodiment are effectively flowable and curable and cure into products having mechanical strength, white color, heat resistance, light resistance, and a high thermal conductivity. It is proven that an optoelectronic package in which an LED is enclosed in the cured product (reflector) of the composition performs well.

hours, forming test pieces. They were subjected three times to IR reflow at a temperature of 260° C. Using a multi-purpose bond tester DAGE Series 4000, the bond strength at room temperature was measured while pulling the test piece at a speed of 0.2 mm/sec.

TABLE 3

| Composition (pbw) | | | Example 7 | Example 8 | Example 9 | Comparative Example 5 | Comparative Example 6 |
|---|---|---|---|---|---|---|---|
| A. Heat-curable organopolysiloxane | | A-1 | 100 | 100 | 100 | 100 | 100 |
| B. White pigment | Titanium dioxide | B-1 | 100 | 100 | 100 | | |
| C. Inorganic filler | Alumina A | C-1 | 200 | 200 | 200 | | |
| | Spherical fused silica | C-4 | | | | 200 | 200 |
| D. Condensation catalyst | Zinc benzoate | D-1 | 1.4 | 1.4 | 1.4 | 1.4 | 1.4 |
| E. Parting agent | Calcium stearate | E-1 | 2.4 | 2.4 | 2.4 | 2.4 | 2.4 |
| F. Silane coupling agent | KBM-803 | F-1 | 0.5 | 0.5 | 0.5 | 0 | 0.5 |
| | KBM-403 | F-2 | 2 | 2 | 2 | 0 | 2 |
| G. Adhesive aid | TEPIC-S | G-1 | 2.5 | 5 | 10 | 0 | 0 |
| Test results Ag bond test | After post-cure (MPa) | | 5.1 | 7.2 | 6.1 | 1.5 | 3.0 |
| | After IR reflow (MPa) | | 3.5 | 6.7 | 5.7 | 0.9 | 1.8 |
| Cu bond test | After post-cure (MPa) | | 3.9 | 5.9 | 6.2 | 1.8 | 3.9 |
| | After IR reflow (MPa) | | 5.4 | 5.7 | 6.2 | 1.2 | 3.0 |
| Pd bond test | After post-cure (MPa) | | 3.6 | 5.0 | 5.3 | 1.2 | 3.9 |
| | After IR reflow (MPa) | | 3.8 | 4.5 | 5.6 | 0.7 | 3.2 |
| Thermal conductivity (W/mK) | | | 2.5 | 2.5 | 2.5 | 0.8 | 0.8 |

Examples 7 to 9 & Comparative Examples 5 to 6

The raw materials used in Examples and Comparative Examples are described below.
A. Heat-Curable Organopolysiloxane
  This is the same as in Examples 1 to 6.
B. White Pigment
B-1: titanium dioxide (CR-95 by Ishihara Sangyo K. K.)
C. Inorganic Filler
C-1: alumina A (the same as in Examples 1 to 6)
D. Condensation Catalyst
D-1: zinc benzoate (Wako Pure Chemical Industries, Ltd.)
E. Parting Agent
E-1: calcium stearate (Wako Pure Chemical Industries, Ltd.)
F. Silane Coupling Agent
F-1: 3-mercaptopropyltriethoxysilane (KBM-803 by Shin-Etsu Chemical Co., Ltd.)
F-2: 3-glycidoxypropyltriethoxysilane (KBM-403 by Shin-Etsu Chemical Co., Ltd.)
G. Adhesive Aid
G-1: tris(2,3-epoxypropyl)isocyanurate (TEPIC-S by Nissan Chemical Industries, Ltd., epoxy equivalent 100)

White silicone resin compositions were prepared by blending the foregoing components in accordance with the formulation shown in Table 3. They were examined by the following adhesion test, with the results shown in Table 3.

Adhesion Test

The silicone resin composition was molded on 20×20 mm frame substrates of three metals (Ag, Cu, Pd) at 175° C. and 70 kgf/mm² for 90 seconds and post cured at 180° C. for 4

The test results in Table 3 demonstrate that the white heat-curable silicone resin compositions cure to metal substrates at a high bond strength with an excellent heat conductivity. It is proven that an optoelectronic package in which an LED is enclosed in the cured product (reflector) of the composition performs well.

Japanese Patent Application Nos. 2008-150328 and 2008-150356 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A white heat-curable silicone resin for forming optoelectronic part cases, comprising
  (A) a heat-curable organopolysiloxane having the average compositional formula (1):

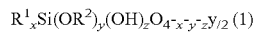

$$R^1_x Si(OR^2)_y (OH)_z O_{4-x-y-z/2} \quad (1)$$

wherein $R^1$ is each independently an organic group of 1 to 20 carbon atoms, $R^2$ is each independently an organic group of 1 to 4 carbon atoms, x, y and z are numbers satisfying $0.8 < x < 1.5$, $0 < y < 0.3$, $0.001 < z < 0.5$ and $0.801 < x+y+z < 2$,
  (B) a white pigment,
  (C) an inorganic filler excluding the white pigment, and
  (D) a condensation catalyst,
  wherein a particulate mixture of the white pigment (B) and the inorganic filler (C) has a particle size distribution having maximum peaks in the three ranges of 0.4 to 1.0 μm, 8 to 18 μm, and 30 to 50 μm, said composition having a thermal conductivity of 1 to 10 W/mK.

2. A white heat-curable silicone resin for forming optoelectronic part cases, comprising
(A) a heat-curable organopolysiloxane,
(B) a white pigment,
(C) an inorganic filler excluding the white pigment, and
(D) a condensation catalyst,
(E), in an amount of 0.2 to 5.0% by weight based on the total weight of the composition, a parting agent comprising calcium stearate having a melting point of 120 to 140° C.
wherein a particulate mixture of the white pigment (B) and the inorganic filler (C) has a particle size distribution having maximum peaks in the three ranges of 0.4 to 1.0 µm, 8 to 18 µm, and 30 to 50 µm,
said composition having a thermal conductivity of 1 to 10 W/mK.

3. The composition of claim 1 wherein
the white pigment (B) is one or more members selected from the group consisting of titanium dioxide having an average particle size of 0.05 to 5.0 µm, and potassium titanate, zirconium oxide, zinc sulfide, zinc oxide, alumina, and magnesium oxide, each having an average particle size of 0.1 to 3.0 µm, and
the inorganic filler (C) is one or more members selected from the group consisting of alumina, zinc oxide, silicon nitride, aluminum nitride and boron nitride, each having an average particle size of 4 to 40 µm.

4. The composition of claim 1 or claim 2, wherein the white pigment (B) and the inorganic filler (C) are present in a total amount of 50 to 95% by weight based on the total weight of the composition.

5. The composition of claim 1 or claim 2, wherein the white pigment (B) is titanium dioxide.

6. The composition of claim 1 or claim 2 which further comprises (F) a silane coupling agent and/or (G) an adhesive aid which is a 1,3,5-triazine nucleus derivative epoxy resin having the compositional formula (2):

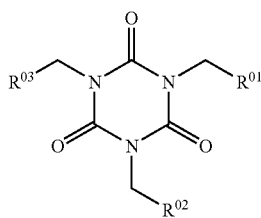

(2)

wherein $R^{01}$, $R^{02}$ and $R^{03}$ each are an organic group of 1 to 10 carbon atoms, at least one of $R^{01}$, $R^{02}$ and $R^{03}$ containing an epoxy group.

7. The composition of claim 1 or claim 2, wherein the condensation catalyst (D) is an organometallic condensation catalyst.

8. The composition of claim 7 wherein the organometallic condensation catalyst is zinc benzoate.

9. An optoelectronic part case comprising a silicone resin composition in the cured state, said composition having a thermal conductivity of 1 to 10 W/mK and comprising
(A) a heat-curable organopolysiloxane,
(B) a white pigment,
(C) an inorganic filler excluding the white pigment, and
(D) a condensation catalyst,
wherein a particulate mixture of the white pigment (B) and the inorganic filler (C) has a particle size distribution having maximum peaks in the three ranges of 0.4 to 1.0 µm, 8 to 18 µm, and 30 to 50 µm,
in which a transparent resin-encapsulated optoelectronic part is enclosed.

10. The composition of claim 9, wherein
the white pigment (B) is one or more members selected from the group consisting of titanium dioxide having an average particle size of 0.05 to 5.0 µm, and potassium titanate, zirconium oxide, zinc sulfide, zinc oxide, alumina, and magnesium oxide, each having an average particle size of 0.1 to 3.0 µm, and
the inorganic filler (C) is one or more members selected from the group consisting of alumina, zinc oxide, silicon nitride, aluminum nitride and boron nitride, each having an average particle size of 4 to 40 µm.

11. The composition of claim 9, wherein the white pigment (B) and the inorganic filler (C) are present in a total amount of 50 to 95% by weight based on the total weight of the composition.

12. The composition of claim 9, wherein the silicone resin composition comprises
(A) a heat-curable organopolysiloxane having the average compositional formula (1):

$$R^1_x Si(OR^2)_y(OH)_z O_{(4-x-y-z)/2}$$ (1)

wherein $R^1$ is each independently an organic group of 1 to 20 carbon atoms, $R^2$ is each independently an organic group of 1 to 4 carbon atoms, x, y and z are numbers satisfying $0.8 \leq x \leq 1.5$, $0 \leq y \leq 0.3$, $0.001 \leq z \leq 0.5$, and $0.801 \leq x+y+z < 2$,
(B) a white pigment,
(C) an inorganic filler excluding the white pigment, and
(D) a condensation catalyst,
wherein a particulate mixture of the white pigment (B) and the inorganic filler (C) has a particle size distribution having maximum peaks in the three ranges of 0.4 to 1.0 µm, 8 to 18 µm, and 30 to 50 µm,
said composition having a thermal conductivity of 1 to 10 W/mK.

13. The composition of claim 9, wherein the white pigment (B) is titanium dioxide.

14. The composition of claim 9, wherein the silicone resin composition comprises
(A) a heat-curable organopolysiloxane,
(B) a white pigment,
(C) an inorganic filler excluding the white pigment,
(D) a condensation catalyst, and
(E), in an amount of 0.2 to 5.0% by weight based on the total weight of the composition, a parting agent comprising calcium stearate having a melting point of 120 to 140° C.,
wherein a particulate mixture of the white pigment (B) and the inorganic filler (C) has a particle size distribution having maximum peaks in the three ranges of 0.4 to 1.0 µm, 8 to 18 µm, and 30 to 50 µm,
said composition having a thermal conductivity of 1 to 10 W/mK.

15. The composition of claim 9 which further comprises (F) a silane coupling agent and/or (G) an adhesive aid which is a 1,3,5-triazine nucleus derivative epoxy resin having the compositional formula (2):

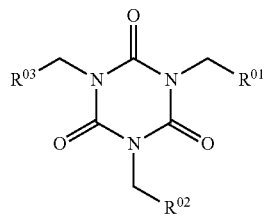
(2)
wherein $R^{01}$, $R^{02}$ and $R^{03}$ each are an organic group of 1 to 10 carbon atoms, at least one of $R^{01}$, $R^{02}$ and $R^{03}$ containing an epoxy group.
16. The composition of claim 9, wherein the condensation catalyst (D) is an organometallic condensation catalyst.
* * * * *